United States Patent
Crowder et al.

(10) Patent No.: US 6,709,910 B1
(45) Date of Patent: Mar. 23, 2004

(54) METHOD FOR REDUCING SURFACE PROTRUSIONS IN THE FABRICATION OF LILAC FILMS

(75) Inventors: Mark A. Crowder, Portland, OR (US); Apostolos T. Voutsas, Vancouver, WA (US); Masahiro Adachi, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/273,549

(22) Filed: Oct. 18, 2002

(51) Int. Cl.[7] ............................................. H01L 21/336
(52) U.S. Cl. ........................ 438/197; 438/486; 438/530
(58) Field of Search ..................... 438/197, 486–488, 438/530–535; 257/65, 59

(56) References Cited

U.S. PATENT DOCUMENTS

2003/0010980 A1 * 1/2003 Yamazaki et al. ............. 257/65
2003/0089909 A1 * 5/2003 Miyairi et al. ................. 257/59
2003/0119287 A1 * 6/2003 Yamazaki et al. ........... 438/535

OTHER PUBLICATIONS

J.S. Im, et al., Controlled Super–Lateral Growth of Si Films for Microstructural Manipulation and Optimization, Physica Status Solidi (a) 166, p. 603, 1998.
Robert S Sposili, M A Crowder and James S Im, "Single-crystal {Si} films via a low–substrate–temperature excimer–laser crystallization method", MRS Symp. Proc. 452 (1997) 593.

* cited by examiner

Primary Examiner—Dung Le
(74) Attorney, Agent, or Firm—David C. Ripma; Matthew D. Rabdau; Scott C. Krieger

(57) ABSTRACT

A system and method are provided for reducing film surface protrusions in the fabrication of LILAC films. The method comprises: forming an amorphous film with a first thickness; annealing the film using a LILAC process, with beamlets having a width in the range of 3 to 10 microns; in response to annealing, forming protrusions on the film surface; optionally oxidizing the film surface; thinning the film; and, in response to thinning the film, smoothing the film surface. Typically, the film surface is smoothed to a surface flatness of 300 Å, or less. In some aspects of the method, oxidizing the film surface includes oxidizing the film surface to a depth. Then, thinning the film includes thinning the film to a third thickness equal to the first thickness minus the depth.

19 Claims, 5 Drawing Sheets

Fig. 3 *(PRIOR ART)*

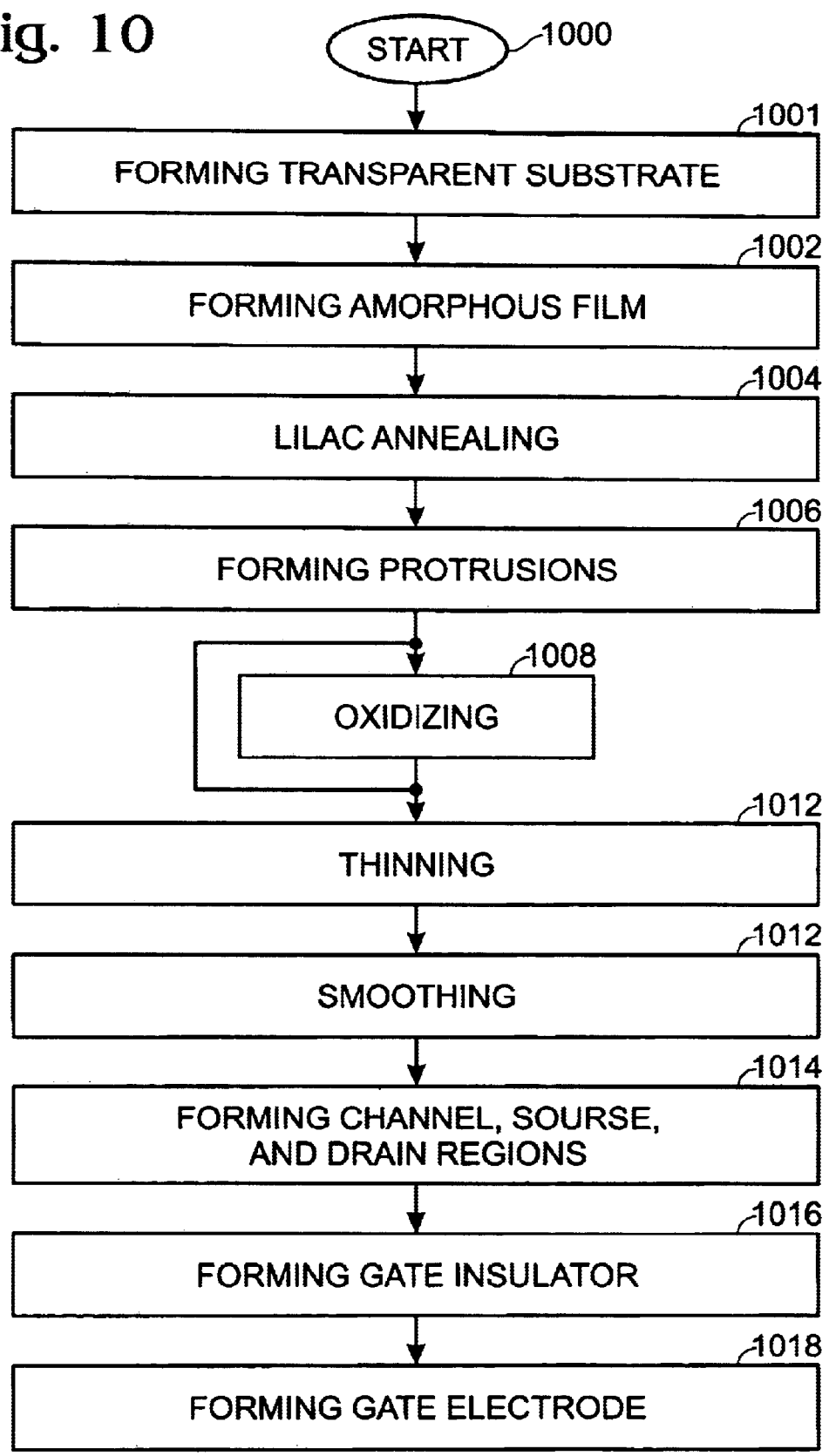

METHOD FOR REDUCING SURFACE PROTRUSIONS IN THE FABRICATION OF LILAC FILMS

BACKGROUND OF THE INVENTION

1. Field of the Invention

This invention generally relates to integrated circuit fabrication and, more particularly, to a system and method for smoothing surface protrusions in the surface of laser annealed semiconductor films.

2. Description of the Related Art

When forming thin film transistors (TFTs) for use in liquid crystal display (LCD) or other microelectronic circuits, the location of transistors channel regions, the orientation of regular structured polycrystalline silicon (poly-Si) or single-grain-crystalline silicon, and the surface roughness are important issues. This poly-Si material can be used as the active layer of poly-Si TFTs in the fabrication of active-matrix (AM) backplanes. Such backplanes can be used in the fabrication of AM LCDs and can be also combined with other display technologies, such as organic light-emitting diode (OLED) displays.

Poly-Si material is typically formed by the crystallization of initially deposited amorphous Si (a-Si) films. This process can be accomplished via solid-phase-crystallization (SPC), for example, by annealing the a-Si films in a furnace at appropriate temperature and for sufficiently long time. Alternatively, laser annealing can also be used to achieve the phase transformation.

Conventionally, crystallization techniques are applied to a substrate in such a manner as to yield uniform poly-Si film quality throughout the substrate area. In other words, there is no spatial quality differentiation over the area of the substrate. The most important reason for this end result is the inability of conventional methods to achieve such quality differentiation. For example, when a-Si film is annealed in a furnace or by rapid-thermal-annealing, all of the film is exposed to the same temperature, resulting in the same quality of poly-Si material. In the case of conventional laser annealing, some differentiation is possible, but the price, in terms of loss of throughput, is very high for the modest performance gains realized.

Recently, a new laser annealing technique has been developed that allows for significant flexibility in the process techniques, permitting controlled variation in resulting film microstructure. This technique relies on lateral growth of Si grains using very narrow laser beams, that are generated by passing a laser beam through a beam-shaping mask, and projecting the image of the mask to the film that is being annealed. The method is called Laser-Induced Lateral Crystallization (LILaC), sequential lateral solidification (SLS), or SLS/LILAC. More conventional solid state or continuous laser annealing processes can be differentiated from LILAC processes by their use of relatively long pulse durations and wide beam widths (or mask apertures). The poly-Si material crystallized by the continuous laser annealing method consists of a large density of grains, and each grain is surrounded by grain boundary. The size of grains are typically ~1 micron ($\mu$m). But the typical channel length of TFT is 2~30 microns, so it is inevitable that channel regions of TFT contain several grain boundaries. These grain boundaries act as electron and hole traps, and degrade the TFT characteristics and reliability. The LILAC process can form larger grain lengths between grain boundaries.

FIG. 1 is a diagram illustrating the LILaC process (prior art). The initially amorphous silicon film is irradiated by a very narrow laser beamlet, with typical widths of a few microns (i.e. 3–51 $\mu$m). Such small beamlets are formed by passing the original laser beam through a mask that has open spaces or apertures (see FIG. 2), and projecting the beamlets onto the surface of the annealed Si-film.

FIG. 2 is a conventional laser annealing mask (prior art). Returning to FIG. 1, the sequence of images 1 through 4 illustrates the growth of long silicon grains. A step-and-repeat approach is used. The shaped laser "beamlet" (indicated by the 2 parallel, heavy black lines) irradiates the film and then steps by a distance smaller than half of the width of the slit. As a result of this deliberate advancement of each beamlet, grains are allowed to grow laterally from the crystal seeds of the poly-Si material formed in the previous step. This is equivalent to laterally "pulling" the crystals, as in zone-melting-crystallization (ZMR) method or other similar processes. As a result, the crystal tends to attain very high quality along the "pulling" direction, in the direction of the advancing beamlets. This process occurs simultaneously at each slit on the mask, allowing for rapid crystallization of the area covered by the projection of the mask on the substrate. Once this area is crystallized, the substrate moves to a new (unannealed) location and the process is repeated.

FIG. 3 is a pictorial representation of a system to accomplish the optical projection and the step-and repeat process (prior art). The LILaC process has the potential for creating intentional spatial variations in the quality of the poly-Si material. Such intentional variations can be beneficial for applications where multiple components are integrated on a display, where each component has different specifications and material performance requirements.

Some poly-Si materials formed through the LILaC process have a highly periodical microstructure, where crystal bands of specific width are separated by high-angle grain boundaries. Within the crystal bands, low-angle boundaries are observed with a frequency of occurrence dependent upon certain specifics of the crystallization process, such as film thickness, laser fluence (energy density), pulse duration, and the like. TFTs fabricated on such poly-Si films demonstrate very good characteristics, as long as the direction of conduction is parallel to the direction of the in-crystal low-angle boundaries.

TFTs with greater electron mobility can be fabricated if the substrate crystallization characteristics can be made more isotropic. In other words, the TFT performance depends upon the angle between the main crystalline growth direction, the direction parallel to the laser scanning axis, and the TFT channel. This is due to the formation of sub-boundaries within the crystal domains. The surface roughness at the "hard" grain boundaries, at the edges of the crystal bands/domains, can be significant. This surface roughness prohibits the reduction of the gate insulator thickness, which is one critical step for scaling down the device geometry for future applications. Further, not all of these processes can be location controlled. Therefore, by chance only, depending upon the relative size of the crystal domain and the TFT channel length, certain TFTs will not include grain-boundaries in their active area (channel), whereas other TFTs will include one or more boundaries in their active areas. This kind of non-uniformity is highly detrimental for critical-application TFTs where uniformity of characteristics is more essential than absolute performance.

FIG. 4 is partial cross-sectional view of FIG. 1 illustrating the surface topography of laser-irradiated domains (prior art). After the completion of the lateral growth, the two crystal fronts meet at the center of the domain where they form a "boundary" between the two crystal regions developing from each opposing edge of the domain. As a result of the grain boundary formation, a "ridge" develops at the surface of the film at the boundary, corresponding to the planned congruence of the two crystal fronts. Since the substrate steps under the beam a distance of d, where d is less than L/2, the ridge is irradiated is a subsequent shot. This ridge remelts and locally planarizes. However, as part of the same process, another ridge is formed at a new location. Therefore, the ridge location will "march" across the substrate in response to the scans under the beam.

For single-crystal regions or directionally solidified material, devices can be fabricated on crystallized regions that have no protrusions. But for large-grained polycrystalline SLS material (e.g., material produced via the 2-shot or $2^N$ processes), there can be a large number of surface protrusions that can adversely affect the device performance and limit the thickness of gate insulator that can be used. Thus, it is imperative that these protrusions be eliminated for optimal device performance.

If the angle of rotation between the lattice mismatch on the two sides of the boundary is less than approximately 15 degrees, the boundary is considered to be a low-angle boundary. An angle of rotation between 15 and 90 degrees is considered to be a high-angle boundary. Electron mobility between high-angle boundaries is impaired, while mobility between low-angle boundaries is usually insignificant. The step-and-repeat annealing typically promotes low-angle boundaries. However, the film regions corresponding to the mask edges, not being subject to the step-and-repeat process, are likely to form high-angle boundaries.

One embodiment of the SLS/LILaC process involves the use of a large array of narrow slits that simultaneously melt and solidify the Si thin film in such a way as to filly crystallize the entire film after two passes that are stitched together. The drawback to such an approach is that due to volume expansion of the Si material during solidification, a large peak appears in the center of each irradiated region with a magnitude approximately equal to that of the film thickness. This peak-to-valley roughness can be detrimental to the characteristics of devices subsequently fabricated on the thin film. One way to eliminate or reduce the magnitude of this surface roughness is to partially melt the Si thin film and cause the mass to redistribute itself to reduce the surface tension of the liquid material. A mask that uses diffractive optics can be used to create a homogenous beam with a reduced transmission in the energy density at the sample plane. This homogenous beam then "flood"irradiates the sample and induces partial melting of the film.

It would be advantageous if the surface of laser annealed films could be made more smooth, so that thinner overlying films could be formed.

It would be advantageous if the post annealing surface smoothing process could be further refined to increase throughput and to reduce processing times.

SUMMARY OF THE INVENTION

The present invention describes a system and method to smooth protrusions from the surface of LILAC annealed films. Generally, the films are intentionally made thicker than required. The film surface and, therefore, the protrusions can (optionally) be oxidized. Then, the "extra" thickness, including the protrusions, is removed, resulting in a smooth surfaced film with the intended thickness.

Accordingly, a method is provided for reducing film surface protrusions in the fabrication of LILAC films. The method comprises: forming an amorphous film having a first thickness; annealing the film using a LILAC process, with beamlets having a width in the range of 3 to 10 microns; in response to annealing, forming protrusions on the film surface; oxidizing the film surface (in some aspects of the method); thinning the film; and, in response to thinning the film, smoothing the film surface. Typically, the film surface is smoothed to a surface flatness of 300 Å, or less.

In some aspects of the method, the amorphous film is silicon and has a thickness of greater than 500 Å and less than 3000 Å. Oxidizing the film surface includes oxidizing the film surface to a depth. Then, thinning the film includes thinning the film to a third thickness equal to the first thickness minus the depth. Typically, the film is thinned to a thickness of less than 1000 Å.

Additional details of the above-described method and a polycrystalline thin film with a smooth surface are described below.

BRIEF DESCRIPTION OF THE DRAWINGS

FIG. 10 is a flowchart illustrating the present invention method for reducing film surface protrusions in the fabrication of laser-induced lateral crystallization (LILAC) films.

DETAILED DESCRIPTION OF THE PREFERRED EMBODIMENTS

Figure 5:
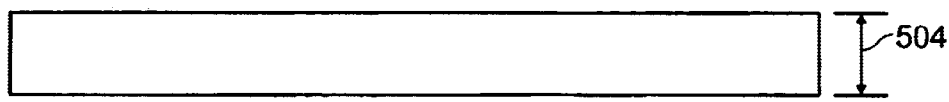
FIG. 5 is a partial cross-sectional view of the present invention polycrystalline thin film structure.

FIG. 5 is a partial cross-sectional view of the present invention polycrystalline thin film structure 500. The film 502 has an amorphous crystalline structure and a temporary thickness 504, formed prior to the resultant thickness (800, see FIG. 8). The film 502 is made of a material such as silicon or silicon germanium, although the invention could also be extrapolated for use with other film materials. The temporary thickness 504 is in the range of 500 to 3000 Å. The film 502, as shown, is in the as-deposited condition, before LILAC annealing. Any conventional film deposition process is suitable.

Figure 1:
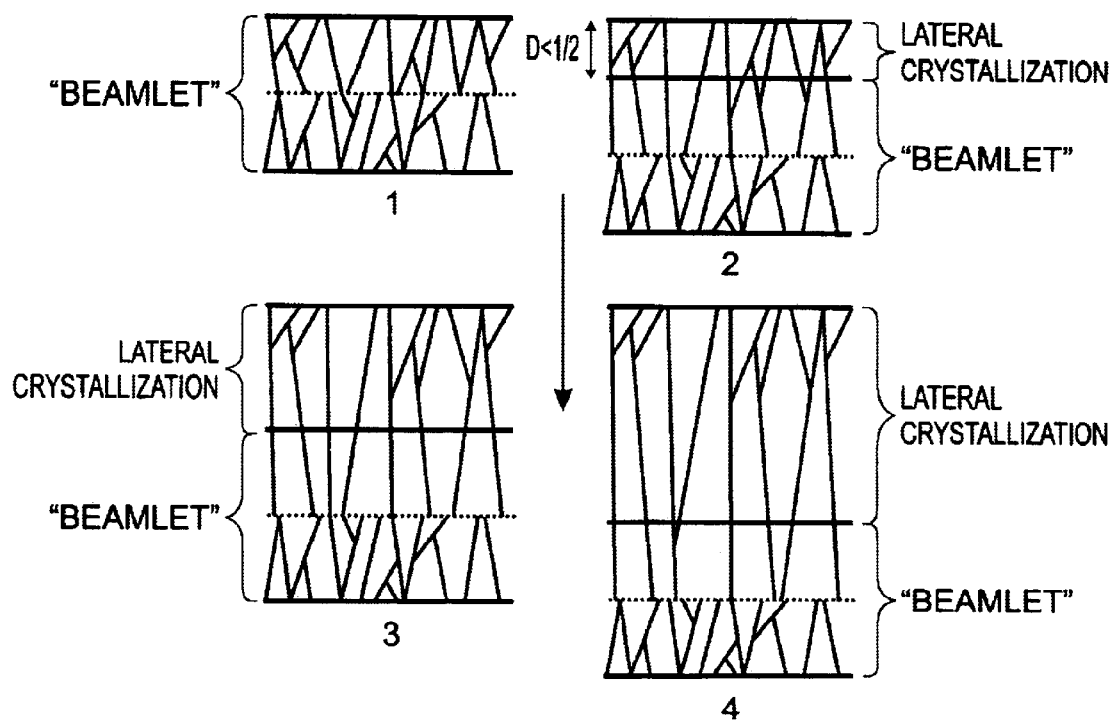
FIG. 1 is a diagram illustrating the LILaC process (prior art).
Figure 2:
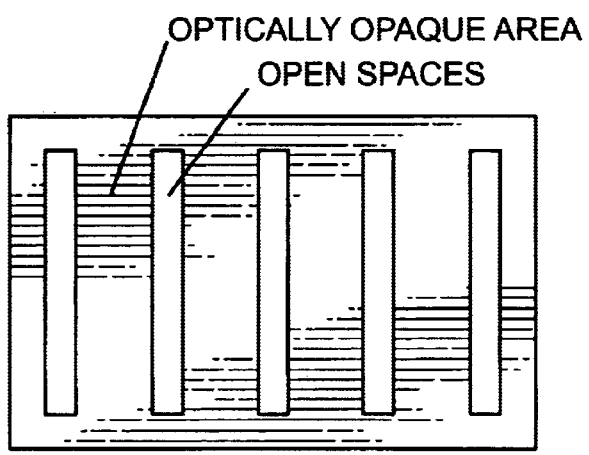
FIG. 2 is a conventional laser annealing mask (prior art).
Figure 3:
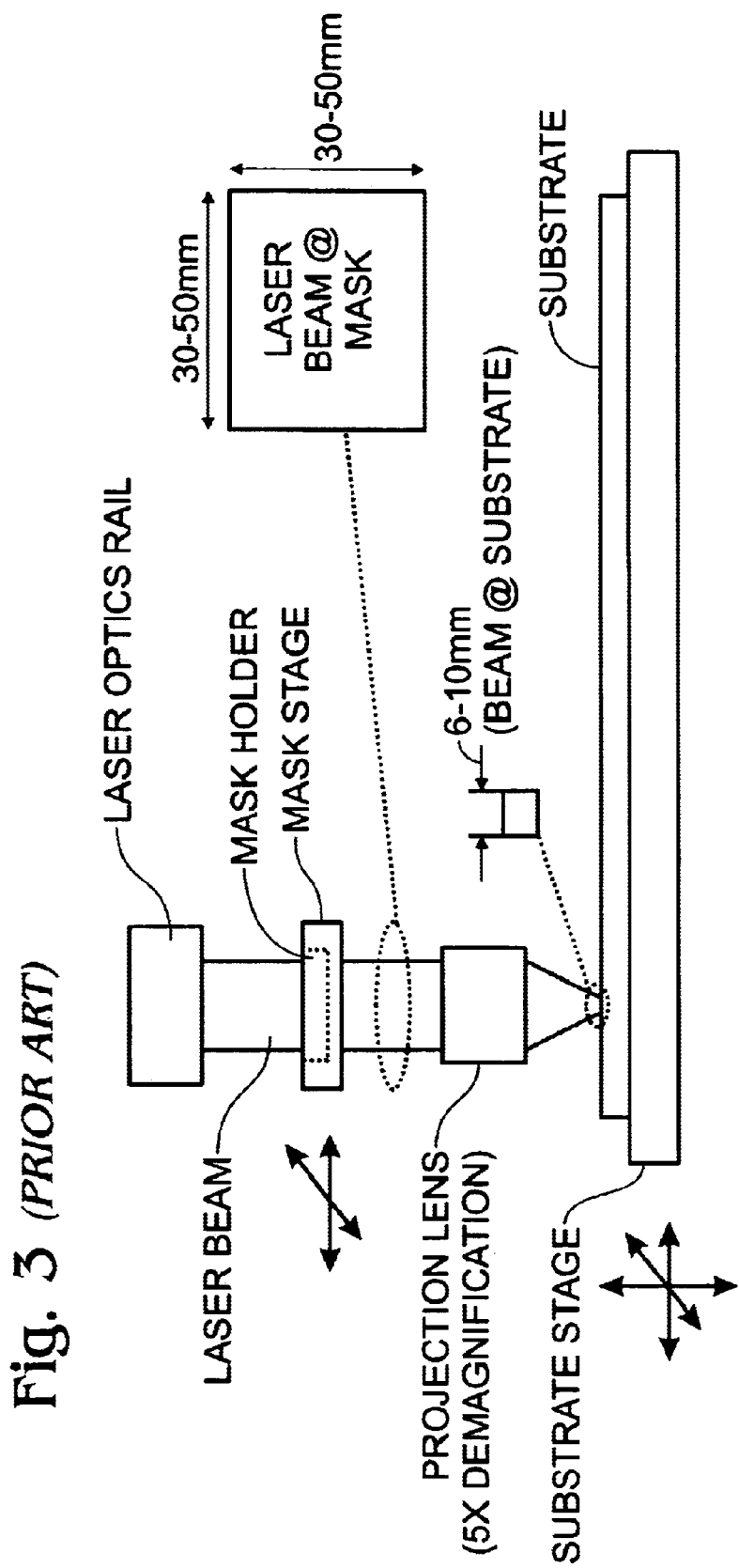
FIG. 3 is a pictorial representation of a system to accomplish the optical projection and the step-and repeat process (prior art).
Figure 4:
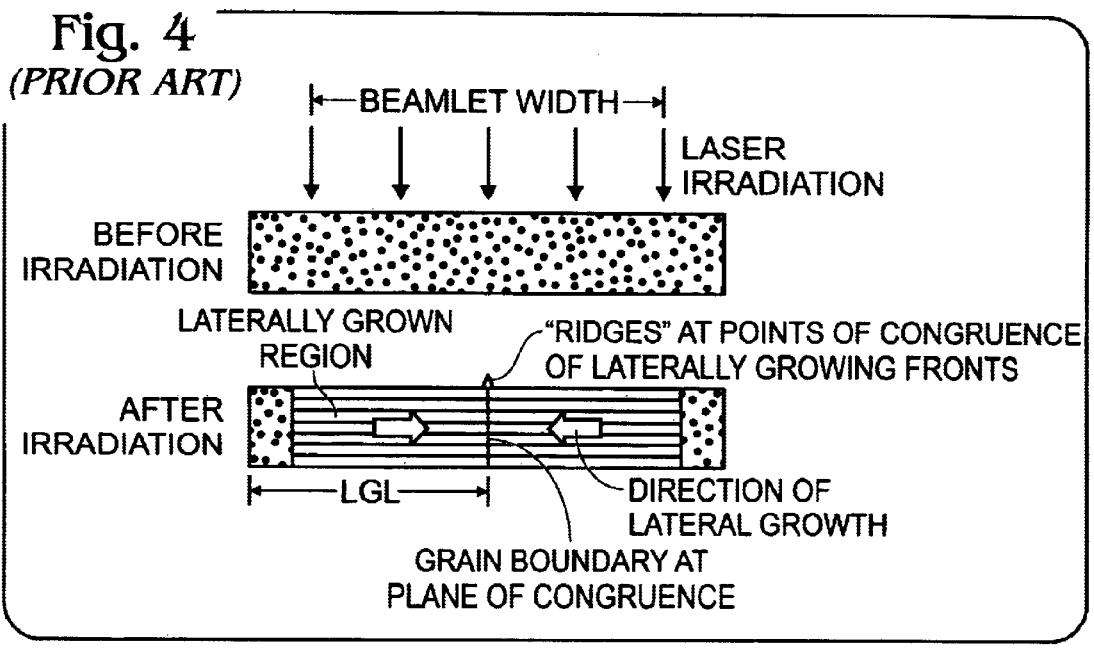
FIG. 4 is partial cross-sectional view of FIG. 1 illustrating the surface topography of laser-irradiated domains (prior art).
Figure 6:
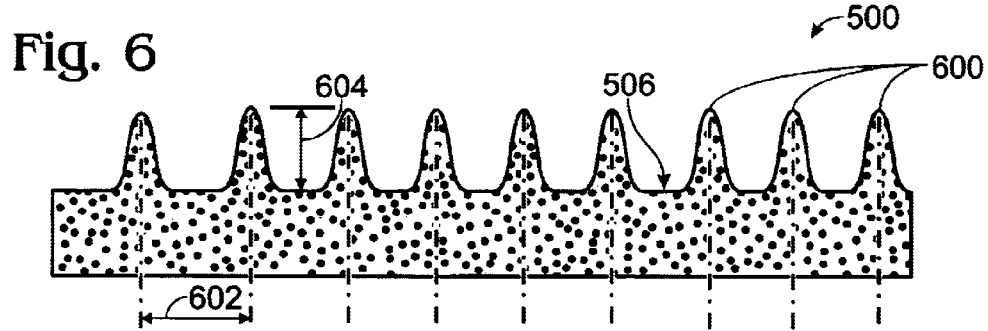
FIG. 6 is a partial cross-sectional view of the polycrystalline thin film structure with temporary protrusions in the film surface resulting from a laser-induced lateral crystallization (LILAC) annealing of the film.

FIG. 6 is a partial cross-sectional view of the polycrystalline thin film structure 500 with temporary protrusions 600 in the film surface 602 resulting from a laser-induced lateral crystallization (LILAC) annealing of the film 502. The formation of these protrusions 600 is described in detail in the Background Section, above. Note, the vertical lines in the film 502, generally underlying the protrusions 600, represent grain boundaries.

In some aspects, the film 502 is silicon and has a temporary thickness (504, see FIG. 5) of about 1000 Å. Crystal grains in the silicon film 502 have a resultant grain length 602 in the range of 1.5 to 4 microns between grain boundaries. In other aspects, the temporary thickness is 500 Å and crystal grains have a resultant grain length 602 in the range of 1.5 to 2.5 microns between grain boundaries.

Figure 7:
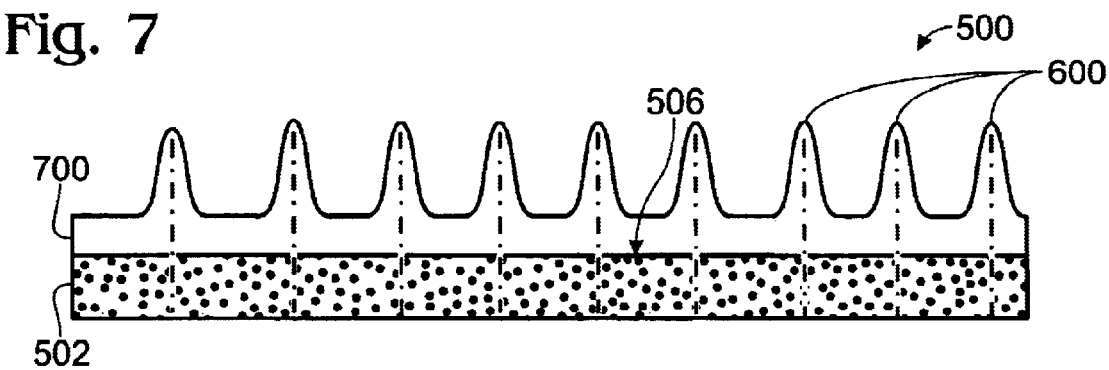
FIG. 7 is a partial cross-sectional view of the polycrystalline thin film structure illustrating a temporary layer of oxide overlying the film surface.
Figure 8:
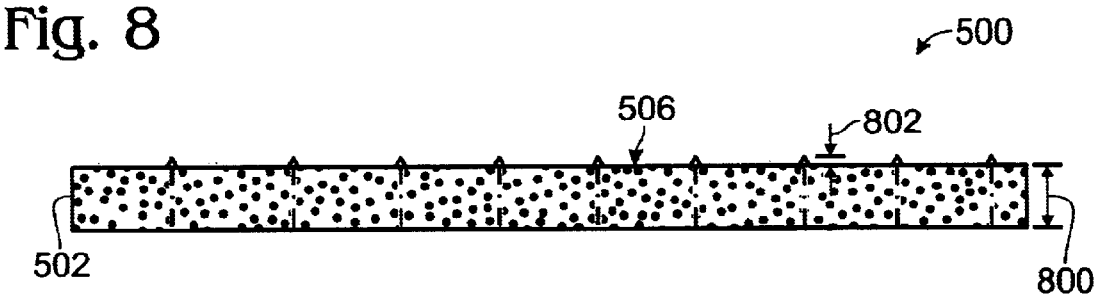
FIG. 8 is a partial cross-sectional view of the present invention polycrystalline thin film structure after thinning.

FIG. 7 is a partial cross-sectional view of the polycrystalline thin film structure 500 illustrating a temporary layer of oxide 700 overlying the film surface 506. The temporary layer of oxide 700 results from an oxidation of the film surface 506. Any conventional oxidation process is suitable. For example, the oxide layer 700 can be formed as a result of thermal oxidation or high-pressure oxidation. As shown, the temporary layer of oxide 700 includes the protrusions 600 being substantially oxide protrusions resulting from the oxidation of the film surface 506. FIG. 8 is a partial cross-sectional view of the present invention polycrystalline thin film structure after removal thinning. The polycrystalline thin film structure 500 comprises the film layer 502, having the film surface 506, and a resultant thickness 800 of less than 1000 Å. The film 502 with the resultant thickness 506 has a surface flatness 802 of about 300 Å, or less.

In some aspects, the oxidation process is not performed. The temporary thickness is thinned, and the temporary protrusions are smoothed, by a CMP process, for example. Alternately stated, the process proceeds from FIG. 6 to FIG. 8, skipping the oxidation process described in FIG. 7. If a temporary oxide layer has been form, an HF etching or CMP process can be used to thin. If the film has not been oxidized, then a CMP process can be used for thinning.

In some aspects, the film temporary thickness (504, see FIG. 5) is about 750 Å and the film resultant thickness 800 is about 500 Å. Returning to FIG. 6, in other aspects the temporary protrusions 600 have a height 604 of greater than half of the film temporary thickness (504, see FIG. 5). Then, the film resultant thickness (800, see FIG. 8) is less than the temporary thickness (504, see FIG. 5). In one aspect, the film temporary thickness is about 750 Å, the temporary protrusions have a height of about 750 Å, and the resultant thickness is about 500 Å.

Figure 9:
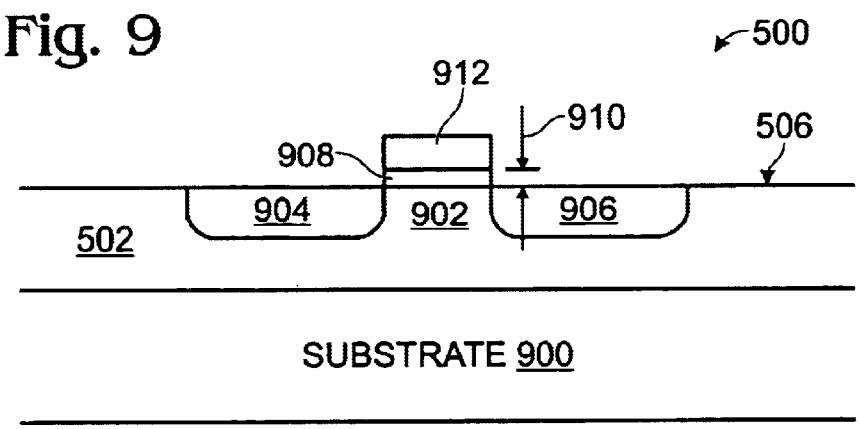
FIG. 9 is a partial cross-sectional view of the polycrystalline thin film structure of FIG. 8, after further processing.

FIG. 9 is a partial cross-sectional view of the polycrystalline thin film structure 500 of FIG. 8, after further processing. As shown, the film 502 overlies a transparent substrate 900. However, the invention is not limited exclusively to the use of transparent substrates. In some aspects (not shown), a diffusion barrier may separate the substrate 900 from the film 502. The film 502 with the resultant thickness includes a channel region 902, a source region 904, and a drain region 906. A gate insulator 908 overlies the film surface 506 having thickness 910 of 500 Å, or less. A gate electrode 912 overlies the gate insulator 908. Although only a single transistor structure is shown, it should be understood that the invention is applicable to the formation of a plurality of adjoining transistors formed from a common film 502.

Functional Description

The SLS process can result in the formation of a large number of protrusions on the film surface that occur at the center of a molten zone. As mentioned above, this occurrence is due to volume expansion of the silicon material as it solidifies, as the density of solid silicon is less than that of liquid silicon. Such protrusions extend above the surface at each grain boundary to a height approximately equal to the pre-annealing film thickness. For example, for a 1,000 Å-thick amorphous film, the protrusions formed by SLS annealing are approximately 1,000 Å high.

Convention methods of removing the protrusions have included using a thick $SiO_2$ cap (thicker than 1–2 $\mu$m), flood irradiation and partial melting of the silicon film to induce mass redistribution (through reduction in the surface tension), or irradiating the same region twice with a lower laser energy density on the second irradiation (again to induce mass redistribution).

The present invention, however, reduces the thickness of the film, through one of several approaches, as a means of smoothing the protrusions. Initially, the SLS process is applied to a slightly thicker film. Thus, if a 500 Å-thick film is desired for example, the SLS is performed on a 1,000 Å-thick precursor film. Once the SLS process is completed, the film is thinned through one of many oxidation schemes, such as high-pressure oxidation for high-temperature incompatible substrates, or through thermal oxidation of the silicon. Then, a subsequent etching in dilute HF, or a chemical-mechanical polishing (CMP) technique is used to remove the oxide. Alternately, if the film has not been oxidized, a CMP process can be used for thinning.

FIG. 10 is a flowchart illustrating the present invention method for reducing film surface protrusions in the fabrication of laser-induced lateral crystallization (LILAC) films. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 1000.

Step 1002 forms an amorphous film with a surface. Typically, the amorphous film is formed to a first thickness of greater than 500 Å and less than 3000 Å. It is also typical that the film is either a silicon or silicon germanium material, although other film materials are possible. Step 1004 anneals the film with a surface, using a LILAC process. In some aspects, the LILAC process uses laser beamlets having a width in the range of 3 to 10 microns. Step 1006 forms protrusions on the film surface, in response to annealing. Step 1008 oxidizes the film surface. In some aspects, either a high-pressure oxidation or thermal oxidation processes is used, although the method is not limited to any particular oxidation process. Note that Step 1008 is not performed in all aspects of the invention. Step 1010 thins the film. In many aspects, the film is thinned to a thickness of less than 1000 Å. Step 1012, in response to thinning the film, smoothes the film surface. Thinning the film includes removing the oxidized film surface in some aspects of the method. In some aspects, the oxidized film surface is removed using either dilute hydrofluoric (HF) acid or a chemical-mechanical polishing (CMP) process. However, the method is not limited to any particular oxidation removal process. Alternately, Step 1010 uses a CMP process to thin the annealed film to a second thickness, less than the first thickness, without a prior step of oxidation (Step 1008). Typically, the film surface can be smoothed to a surface flatness of 300 Å, or less.

In some aspects, oxidizing the film surface in Step 1008 includes oxidizing the film surface to a depth. The depth does not include the height associated with protrusions. That is, the depth is defined in the flat surface regions between protrusions. Then, thinning the film in Step 1010 includes thinning the film to a third thickness equal to the first thickness minus the depth.

In other aspects, forming an amorphous film in Step 1002 includes forming an amorphous silicon film having a thickness of 1000 Å. Then, annealing a film using a LILAC process in Step 1004 includes forming crystal grains having a resultant grain length in the range of 1.5 to 4 microns between grain boundaries. Alternately, Step 1002 forms an amorphous silicon film having a thickness of 500 Å, and Step 1004 forms crystal grains having a resultant grain length in the range of 1.5 to 2.5 microns between grain boundaries. One advantage of using (initially) thicker films is that it is possible to form longer grain lengths than with (initially) thinner films.

In another aspect, forming an amorphous film in Step 1002 includes forming an amorphous silicon film having a thickness of 750 Å. Then, thinning the film in Step 1010 includes thinning the film to a thickness of 500 Å.

In some aspects, forming surface protrusions on the film surface in response to annealing in Step 1006 includes forming protrusions having a height of greater than half of the amorphous film first thickness. Thinning the film in Step 1010 includes thinning the film to a thickness of less than the amorphous film first thickness.

In another aspect, forming an amorphous film in Step 1002 includes forming an amorphous film having a thickness of 750 Å. Forming surface protrusions on the film surface in response to annealing in Step 1006 includes forming protrusions having a height of 750 Å. Then, thinning the film in Step 1010 includes thinning the film to a thickness of 500 Å.

In some aspects of the method, Step 1001 forms a transparent substrate underlying the amorphous film. Step 1014 forms channel, source, and drain regions in the film following smoothing of the film surface (Step 1012). Step 1016 forms a gate insulator overlying the silicon film surface having a thickness of 500 Å, or less, following the smoothing the film surface. Step 1018 forms a gate electrode overlying the gate insulator.

A system and method have been provided for smoothing the surface of a film following a LILAC annealing process. A few examples of oxidation and oxidation removal processes have been given, but the invention is not necessarily limited to just these processes. Likewise, an example has been given of forming a transistor with the smoothed thin film. However, the present invention is not necessarily limited to just this kind of structure. Other variations and embodiments of the invention will occur to those skilled in the art.

We claim:

1. In the fabrication of laser-induced lateral crystallization (LILAC) films, a method for reducing film surface protrusions, the method comprising:

annealing a film, with a surface, using a LILAC process;

in response to annealing, forming protrusions on the film surface;

thinning the film; and, in response to thinning the film, smoothing the film surface.

2. The method of claim 1 wherein annealing a film using a LILAC process includes using laser beamlets having a width in the range of 3 to 10 microns.

3. The method of claim 1 further comprising:

oxidizing the film surface; and, wherein thinning the film includes removing the oxidized film surface.

4. The method of claim 3 wherein oxidizing the film surface includes using a process selected from the group including high-pressure oxidation and thermal oxidation processes.

5. The method of claim 3 wherein removing the oxidized film surface includes using a process selected from the group including etching with dilute hydrofluoric (HF) acid and chemical-mechanical polishing (CMP).

6. The method of claim 3 further comprising:

forming an amorphous film having a first thickness, wherein oxidizing the film surface includes oxidizing the film surface to a depth; and, wherein thinning the film includes thinning the film to a third thickness equal to the first thickness minus the depth.

7. The method of claim 1 further comprising:

forming an amorphous film having a first thickness of greater than 500 Å and less than 3000 Å.

8. The method of claim 7 wherein forming an amorphous film having a first thickness of greater than 500 Å and less than 3000 Å includes forming a film selected from the group including silicon and silicon germanium films.

9. The method of claim 8 wherein forming an amorphous film having a first thickness of greater than about 500 Å and less than about 3000 Å includes forming an amorphous silicon film having a thickness of 1000 Å; and, wherein annealing a film using a LILAC process includes forming crystal grains having a resultant grain length in the range of 1.5 to 4 microns between grain boundaries.

10. The method of claim 8 wherein forming an amorphous film having a first thickness of greater than about 500 Å and less than about 3000 Å includes forming an amorphous silicon film having a thickness of 500 Å; and, wherein annealing a film using a LILAC process includes forming crystal grains having a resultant grain length in the range of 1.5 to 2.5 microns between grain boundaries.

11. The method of claim 8 wherein thinning the film includes thinning the film to a thickness of less than 1000 Å.

12. The method of claim 11 wherein forming an amorphous film having a first thickness of greater than about 500 Å and less than about 3000 Å includes forming an amorphous silicon film having a thickness of 750 Å; and, wherein thinning the film to a thickness of less than 1000 Å includes thinning the film to a thickness of 500 Å.

13. The method of claim 1 wherein smoothing the film surface includes smoothing the film surface to a surface flatness of 300 Å, or less.

14. The method of claim 7 wherein forming an amorphous film having a first thickness of greater than about 500 Å and less than about 3000 Å includes forming an amorphous film having a thickness;

wherein forming surface protrusions on the film surface in response to annealing includes forming protrusions having a height of greater than half of the amorphous film first thickness; and, wherein thinning the film includes thinning the film to a second thickness of less than the amorphous film first thickness.

15. The method of claim 14 wherein forming an amorphous film having a first thickness of greater than about 500 Å and less than about 3000 Å includes forming an amorphous film having a thickness of 750 Å;

wherein forming surface protrusions on the film surface in response to annealing includes forming protrusions having a height of 750 Å; and, wherein thinning the film includes thinning the film to a thickness of 500 Å.

16. The method of claim 8 further comprising:

following the smoothing the film surface, forming a gate insulator overlying the silicon film surface having a thickness of 500 Å, or less.

17. The method of claim 16 further comprising:

forming a transparent substrate underlying the amorphous film;

following smoothing of the film surface, forming channel, source, and drain regions in the film; and, forming a gate electrode overlying the gate insulator.

18. The method of claim 7 wherein thinning the film includes using a CMP process to thin the annealed film.

19. The method of claim 18 wherein using a CMP process to thin the annealed film includes forming a film having second thickness, less than the first thickness.

* * * * *